(12) United States Patent
Nakamura

(10) Patent No.: US 7,598,156 B2
(45) Date of Patent: Oct. 6, 2009

(54) METHOD OF MANUFACTURING DEVICE HAVING ADHESIVE FILM ON BACK-SIDE SURFACE THEREOF INCLUDING BREAKING THE ADHESIVE WITH TENSION

(75) Inventor: Masaru Nakamura, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/186,994

(22) Filed: Aug. 6, 2008

(65) Prior Publication Data

US 2009/0075458 A1    Mar. 19, 2009

(30) Foreign Application Priority Data

Sep. 14, 2007   (JP)   ............... 2007-238921

(51) Int. Cl.
*H01L 21/46*  (2006.01)
*H01L 21/78*  (2006.01)
*H01L 21/301*  (2006.01)

(52) U.S. Cl. ...................... 438/462; 438/464
(58) Field of Classification Search ............... 438/462, 438/464; 257/E21.235

See application file for complete search history.

(56) References Cited

U.S. PATENT DOCUMENTS

2007/0057378 A1 *   3/2007   Arai et al. .................... 257/777
2007/0218586 A1 *   9/2007   Yoshimura et al. .......... 438/106

FOREIGN PATENT DOCUMENTS

JP    A 2000-182995    6/2000

* cited by examiner

*Primary Examiner*—William M. Brewster
(74) *Attorney, Agent, or Firm*—Greer, Burns & Crain, Ltd.

(57) ABSTRACT

A method of manufacturing a device, including: an adhesive film attaching step of attaching an adhesive film to a back-side surface of a wafer in which devices are formed respectively in a plurality of regions demarcated by planned dividing lines formed in a grid pattern in a face-side surface of the wafer; a wafer supporting step of adhering the adhesive film side of the wafer with the adhesive film attached thereto to a surface of a dicing tape attached to an annular frame; a wafer cutting step of holding the dicing tape side of the wafer adhered to the surface of the dicing tape onto a chuck table of a cutting apparatus, and cutting the wafer along the planned dividing lines by use of a cutting blade having an annular knife edge which is V-shaped in sectional shape of a peripheral part thereof; and an adhesive film breaking step of breaking said adhesive film along cutting grooves formed in the wafer, by expanding the dicing tape so as to exert tension on the adhesive film, after the wafer cutting step is performed.

3 Claims, 10 Drawing Sheets

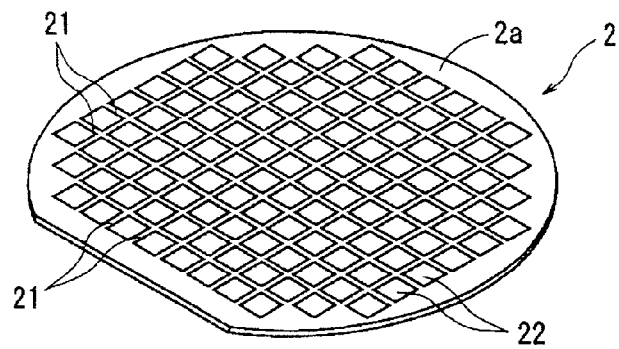
FIG. 4A
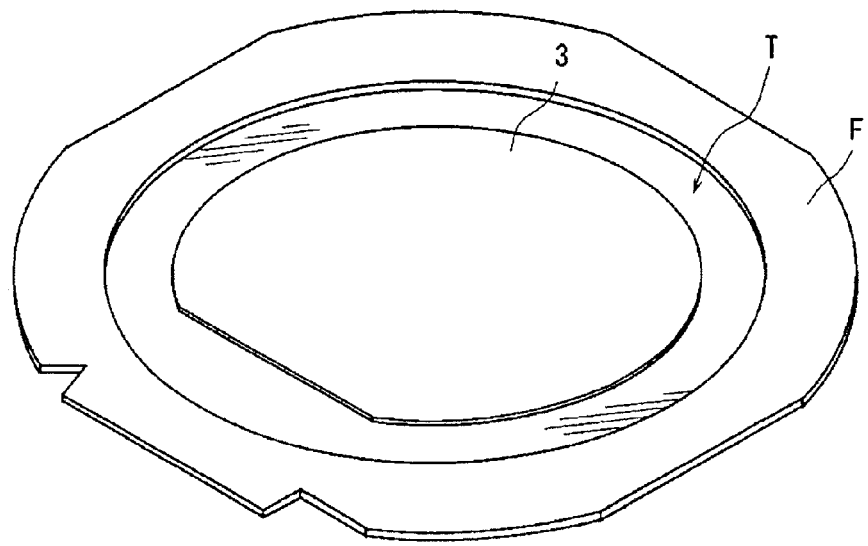
FIG. 4B
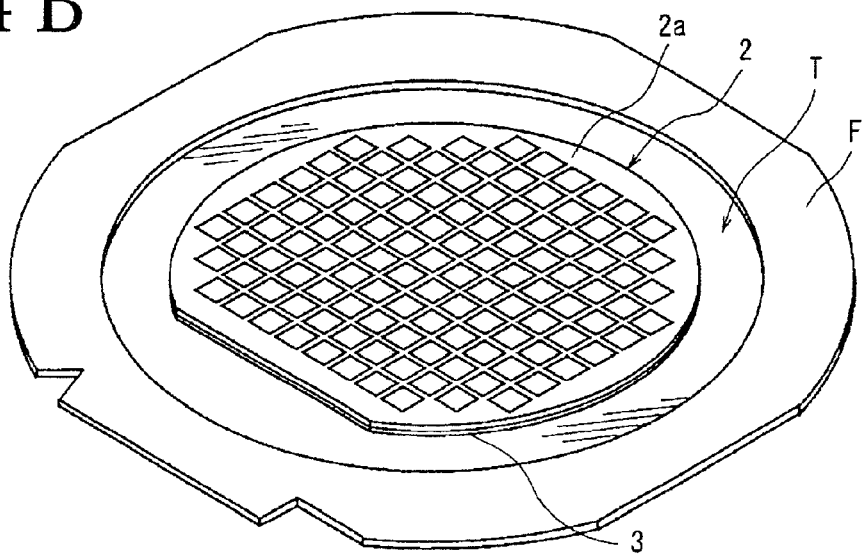

METHOD OF MANUFACTURING DEVICE HAVING ADHESIVE FILM ON BACK-SIDE SURFACE THEREOF INCLUDING BREAKING THE ADHESIVE WITH TENSION

BACKGROUND OF THE INVENTION

1. Field of the Invention

The present invention relates to a method of manufacturing a device, for dividing a wafer in which devices are formed respectively in a plurality of regions demarcated by planned dividing lines formed in a grid pattern in the face-side surface of the wafer, along the planned dividing lines into individual devices, and attaching a die-bonding adhesive film to the back-side surface of each of the devices.

2. Description of the Related Art

For example, in the semiconductor device manufacturing process, devices such as ICs and LSIs are formed in a plurality of regions demarcated by streets (planned dividing lines) formed in a grid pattern in the face-side surface of a roughly circular disk-shaped semiconductor wafer, and the regions provided respectively with the devices are split from each other, to manufacture the individual devices. As a dividing apparatus for dividing the semiconductor wafer, a cutting apparatus generally called dicing apparatus is used. The cutting apparatus is so designed as to cut the semiconductor wafer along the planned dividing lines by a cutting blade having a thickness of about 40 μm. The devices thus split from each other are packaged, to be widely utilized for electric apparatuses such as mobile phones and personal computers.

Each of the individually divided devices has a die-bonding adhesive film, called a die attach film formed from an epoxy resin or the like and having a thickness of 70 to 80 μm, attached to the back-side surface thereof, and is bonded to a device-supporting die bonding frame through the adhesive film by heating. As a method for attaching the die-bonding adhesive film to the back-side surface of the device, a method is ordinarily used in which the adhesive film is adhered to the back-side surface of the semiconductor wafer, the semiconductor wafer is adhered to a dicing tape through the adhesive film, and then the adhesive film is cut together with the semiconductor wafer by the cutting blade along the planned dividing lines formed in the face-side surface of the semiconductor wafer, thereby producing the devices each having the adhesive film attached to the back-side surface thereof (refer to, for example, Japanese Patent Laid-open No. 2000-182995).

Meanwhile, in the method of cutting the adhesive film together with the semiconductor wafer by the cutting blade, the devices would not be damaged even when the adhesive film is cut together with the semiconductor wafer if the thickness of the wafer is large (for example, 500 μm or more). However, where the thickness of the semiconductor wafer is small (for example, 200 μm or less), the adhesive film being in a paste-like state leads to the problem that the semiconductor wafer shows irregular motions during cutting, whereby chipping is generated at side surfaces (cut surfaces) of the devices, and the device quality deteriorates accordingly. In addition, when the adhesive film is cut together with the semiconductor wafer by a cutting blade, cuttings of the adhesive film may be formed in a whisker-like form, to adhere to a bonding pad provided on the device.

Besides, since the knife edge of the cutting blade is formed by consolidating diamond abrasive grains with plating, cutting the adhesive film by the cutting blade leads to clogging at the knife edge, so that frequent dressing is needed, and the life of the cutting blade is decreased accordingly. Incidentally, in order to solve the above-mentioned problem, it may be contemplated to adopt a method in which only the semiconductor wafer is cut by a cutting blade into individual devices, and thereafter the dicing tape to which the adhesive film attached to the back-side surface of the semiconductor wafer is adhered is expanded, thereby breaking the adhesive film along the individual devices. However, the broken surfaces of the adhesive film may become wavy due to the width of the cutting grooves formed in the semiconductor wafer by the cutting blade, and the adhesive film may be separated unevenly, making it difficult to secure a stable device quality.

SUMMARY OF THE INVENTION

Accordingly, it is an object of the present invention to provide a method of manufacturing a device by which a die-bonding adhesive film can be attached to the back-side surface of each device without lowering the device quality.

In accordance with an aspect of the present invention, there is provided a method of manufacturing a device, including: an adhesive film attaching step of attaching an adhesive film to a back-side surface of a wafer in which devices are formed respectively in a plurality of regions demarcated by planned dividing lines formed in a grid pattern in a face-side surface of the wafer; a wafer supporting step of adhering the adhesive film side of the wafer with the adhesive film attached thereto to a surface of a dicing tape attached to an annular frame; a wafer cutting step of holding the dicing tape side of the wafer adhered to the surface of the dicing tape onto a chuck table of a cutting apparatus, and cutting the wafer along the planned dividing lines by use of a cutting blade having an annular knife edge which is V-shaped in sectional shape of a peripheral part thereof; and an adhesive film breaking step of breaking the adhesive film along cutting grooves formed in the wafer, by expanding the dicing tape so as to exert tension on the adhesive film, after the wafer cutting step is performed.

After the adhesive film breaking step is performed, a pick-up step is carried out in which each of the individual devices obtained through division along the planned dividing lines is picked up by detaching the device from the dicing tape, with the adhesive film attached to a back-side surface of the device.

According to the present invention, in the wafer cutting step, only the peripheral edge V-shaped in cross section of the annular knife edge constituting the cutting blade makes contact with the adhesive film, which ensures that the wafer wound not show irregular motions during cutting even if its thickness is small and that chipping would not occur at the cut surfaces of the wafer. In addition, since the adhesive film is not cut in the wafer cutting step, clogging would not occur at the knife edge constituting the cutting blade, and whisker-like cuttings would not be generated. Besides, since the back-side surface of the wafer is cut by only the peripheral edge V-shaped in section of the annular knife edge in the wafer cutting step, the adhesive film is provided with breaking lines extremely small in width or with breaking grooves V-shaped in section, along the planned dividing lines. Therefore, when the dicing tape is expanded in the adhesive film breaking step, the adhesive film is broken along the breaking lines extremely small in width or breaking grooves V-shaped in section. Accordingly, the broken surfaces of the adhesive film become uniform, without becoming wavy.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 4A and 4B illustrate another embodiment of the adhesive film attaching step and the wafer supporting step in the method of manufacturing a device based on the present invention;

DETAILED DESCRIPTION OF THE PREFERRED EMBODIMENTS

Figure 1:
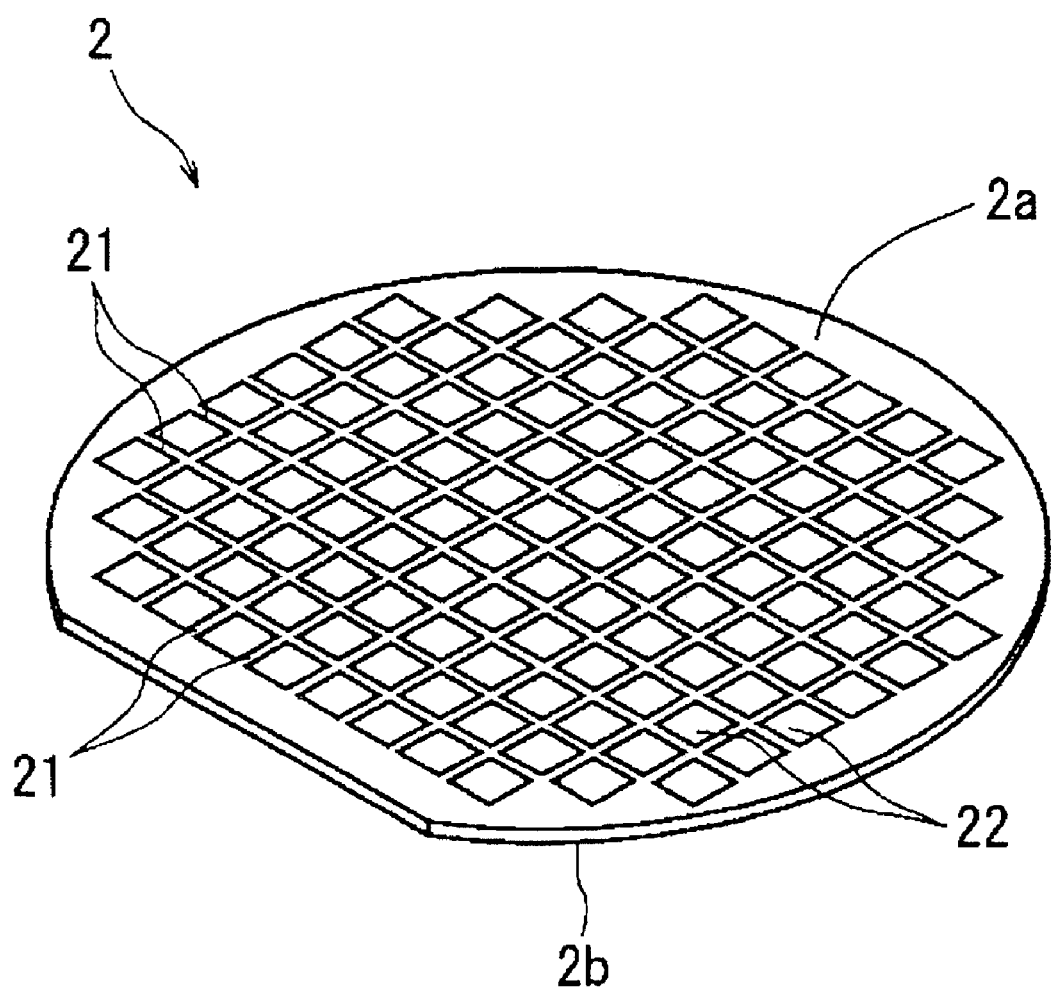
FIG. 1 is a perspective view of a semiconductor wafer as a wafer.

Now, a preferred embodiment of the method of manufacturing a device based on the present invention will be described in detail below, referring to the attached drawings. FIG. 1 shows a perspective view of a semiconductor wafer as a wafer. The semiconductor wafer 2 shown in FIG. 1 is, for example, a silicon wafer having a thickness of 100 µm, and a plurality of planned dividing lines are formed in a grid pattern in a face-side surface 2a of the wafer. Besides, devices 22 such as ICs and LSIs are formed respectively in a plurality of regions demarcated by the plurality of planned dividing lines 21 formed in the grid pattern in the face-side surface 2a of the semiconductor wafer 2.

Figure 2A:
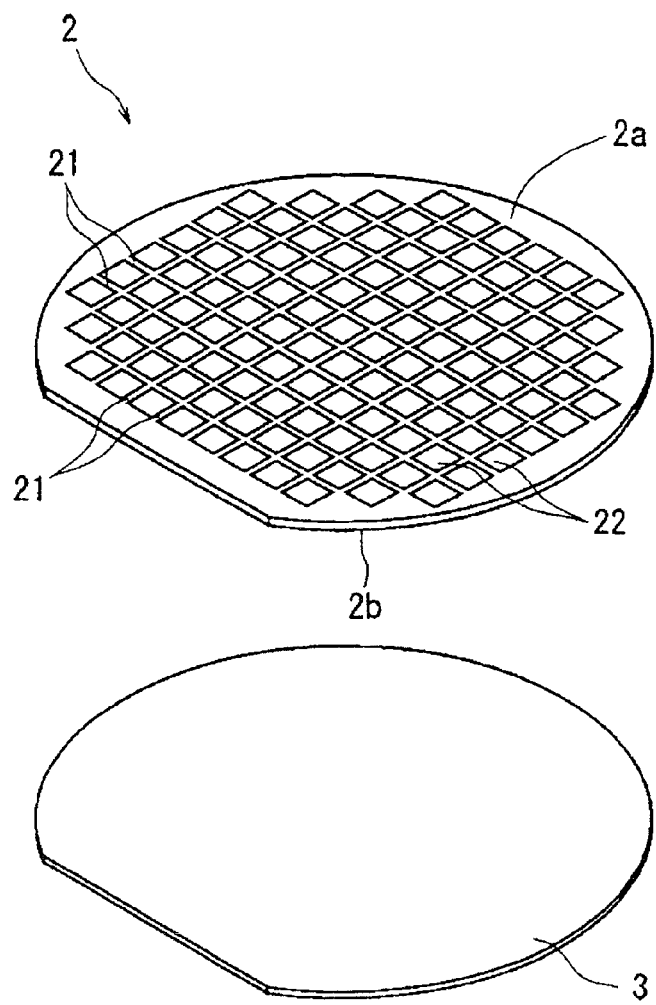
FIGS. 2A and 2B illustrate an adhesive film attaching step in the method of manufacturing a device based on the present invention.
Figure 2B:
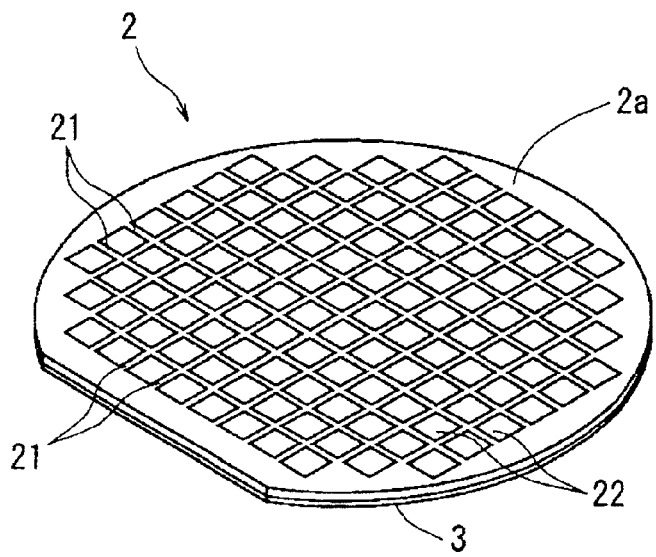

An adhesive film 3 for die bonding is attached to a back-side surface 2b of the semiconductor wafer 2, as shown in FIGS. 2A and 2B (adhesive film attaching step). In this case, the adhesive film 3 being heated at a temperature of 80 to 200° C. is pressed against, and thereby attached to, the back-side surface 2b of the semiconductor wafer 2. Incidentally, in the embodiment shown, the adhesive film 3 is composed of an epoxy resin, with a thickness of 80 µm.

Figure 3A:
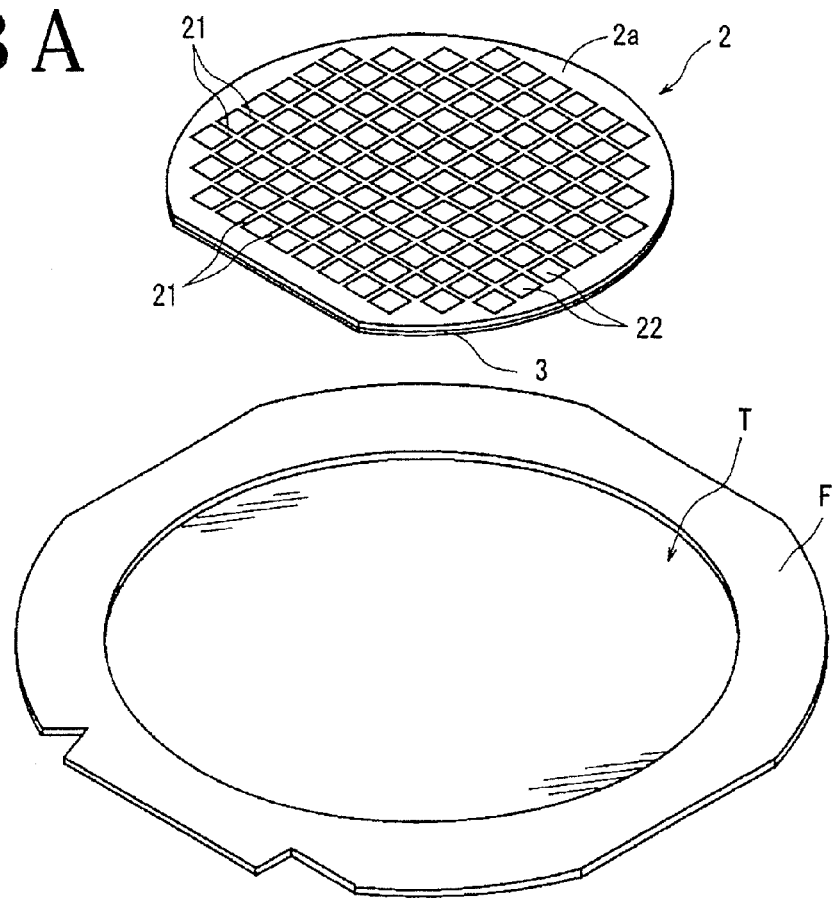
FIGS. 3A and 3B are perspective views for illustrating a wafer supporting step in the method of manufacturing a device based on the present invention.
Figure 3B:
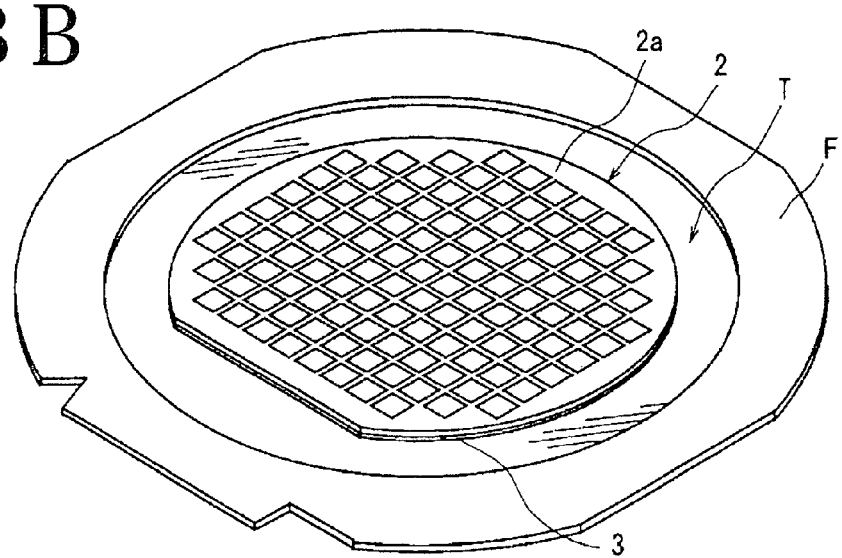

After the adhesive film attaching step is performed, the adhesive film 3 side of the semiconductor wafer 2 is adhered to a surface of a dicing tape T whose peripheral part is so attached as to cover an inside aperture of an annular frame F, as shown in FIGS. 3A and 3B (wafer supporting step). Incidentally, in the embodiment shown, the dicing tape T has a structure in which a sheet base material composed of polyvinyl chloride (PVC) having a thickness of 80 µm has a surface coated with an acrylic resin-based adhesive layer in a thickness of about 5 µm.

Another embodiment of the above-mentioned adhesive film attaching step and wafer supporting step will be described referring to FIGS. 4A and 4B. In the embodiment shown in FIGS. 4A and 4B, a dicing tape with adhesive film, which is obtained by preliminarily adhering an adhesive film 3 to a surface of a dicing tape T, is used. Specifically, as shown in FIGS. 4A and 4B, the adhesive film 3 adhered to a surface of the dicing tape T whose peripheral part is so attached as to cover an inside aperture of an annular frame F is adhered to the back-side surface 2b of the semiconductor wafer 2. In this case, the adhesive film 3 being heated at a temperature of 80 to 200° C. is pressed against, and thereby attached to, the back-side surface 2b of the semiconductor wafer 2. Incidentally, as the dicing tape with adhesive film, a dicing tape with adhesive film (LE5000) produced by Lintec Corporation can be used.

After the wafer supporting step as above is performed, by use of a cutting blade V-shaped in sectional shape of a peripheral part of an annular knife edge, a wafer cutting step is carried out in which the semiconductor 2 adhered to the dicing tape T is cut from the side of the face-side surface 2a thereof along the planned dividing lines 21, and cutting grooves V-shaped in section are formed in the adhesive film 3 along the planned dividing lines 21 by the peripheral edge of the annular knife edge. The wafer cutting step is carried out by using a cutting apparatus 4 shown in FIG. 5. A cutting apparatus 4 shown in FIG. 5 includes a chuck table 41 for holding a work thereon, a cutting means 42 having a cutting blade 420 for cutting the work held on the chuck table 41, and a image pick-up means 43 for picking up an image of the work held on the chuck table 41.

Figure 5:
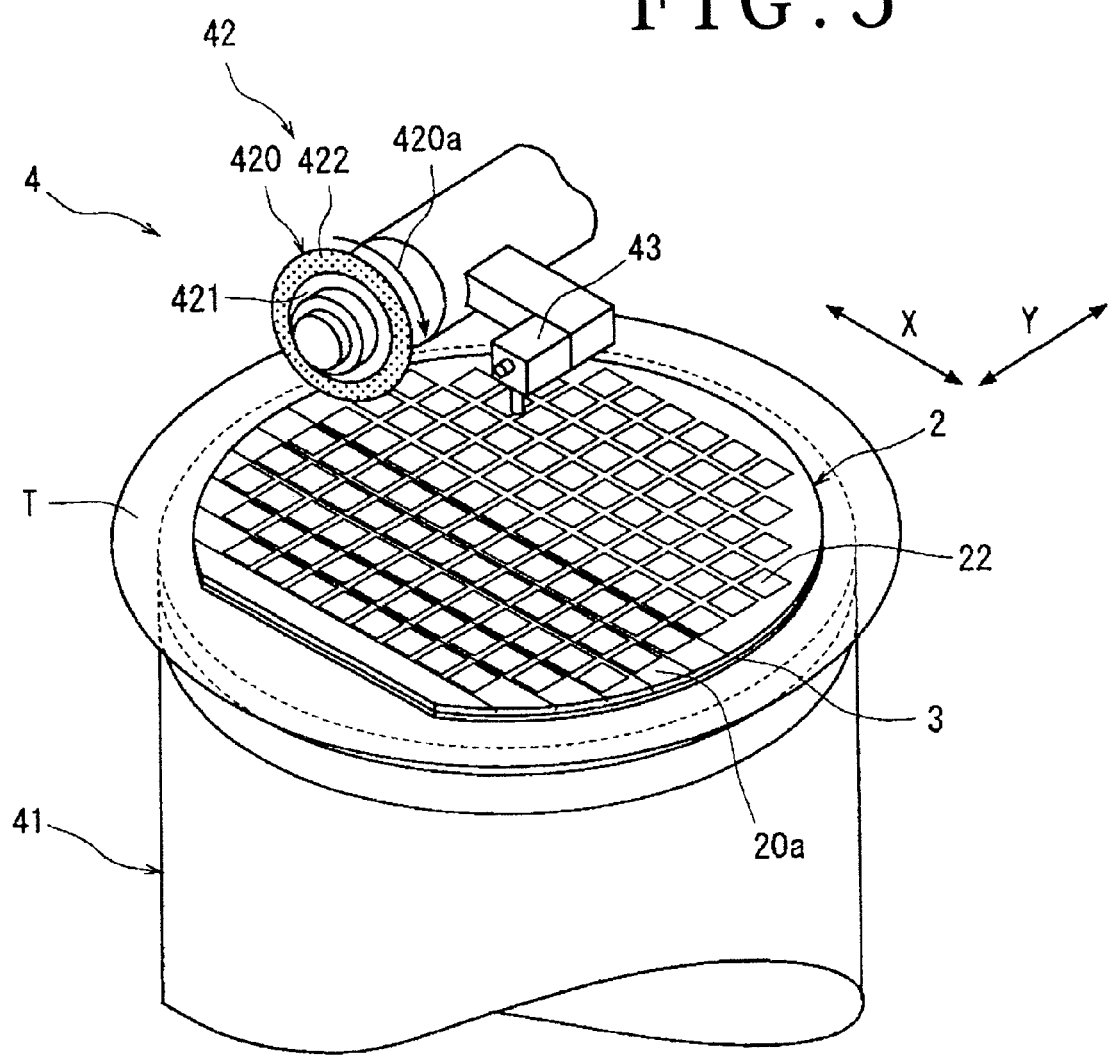
FIG. 5 is a perspective view of an essential part of a cutting apparatus for carrying out a wafer cutting step in the method of manufacturing a device based on the present invention.
Figure 6:
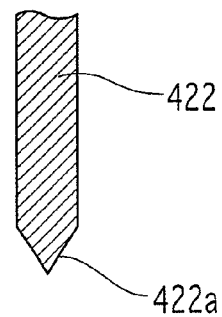
FIG. 6 is a sectional shape of a knife edge of a cutting blade.

The chuck table 41 is so configured as to hold the work by suction, and to be moved in a machining feed direction indicated by arrow X in FIG. 5 and in an indexing feed direction indicated by arrow Y orthogonal to the machining feed direction, by a moving mechanism which is not shown in the figure. The cutting blade 420 includes a circular disk-shaped base 421, and an annular knife edge 422 attached to a side surface peripheral part of the base. The annular knife edge 422 has, for example, a structure in which diamond abrasive grains having a grain diameter of about 3 µm are consolidated by plating, and its peripheral part 422a is V-shaped in sectional shape, as shown in FIG. 6. The image pick-up means 43, in the embodiment shown, includes an ordinary image pick-up device (CCD) for picking up an image by use of visible rays, or the like, and sends a signal of the image picked up to a control means (not shown).

In carrying out the wafer cutting step by use of the cutting apparatus 4 configured as above, the dicing tape T to which the semiconductor wafer 2 has been adhered in the above-mentioned wafer supporting step is mounted on the chuck table 41. Then, a suction means (not shown) is operated to hold the semiconductor 2 by suction onto chuck table through the dicing tape T. Incidentally, while the annular frame F to which the dicing tape T has been attached is omitted in FIG. 5, the annular frame F is fixed by appropriate frame fixing clamps arranged on the chuck table 41. The chuck table 41 with the semiconductor wafer 2 held thereon by suction in this manner is positioned just under the image pick-up means 43 by a cutting feeding mechanism (not shown).

After the chuck table 41 is positioned just under the image pick-up means 43, an alignment step is carried out in which a region to be cut of the semiconductor wafer 2 is detected by the image pick-up means 43 and the control means (not shown). Specifically, the image pick-up means 43 and the control means (not shown) perform an image processing such as pattern matching for position matching between the planned dividing lines 21 formed in the semiconductor wafer 2 in a predetermined direction and the cutting blade 420, thereby conducting alignment of a cutting region (alignment step). Besides, alignment of the cutting region is similarly conducted also with respect to the planned dividing lines 21 formed in the semiconductor wafer 2 to extend orthogonally to the predetermined direction.

Figure 7:
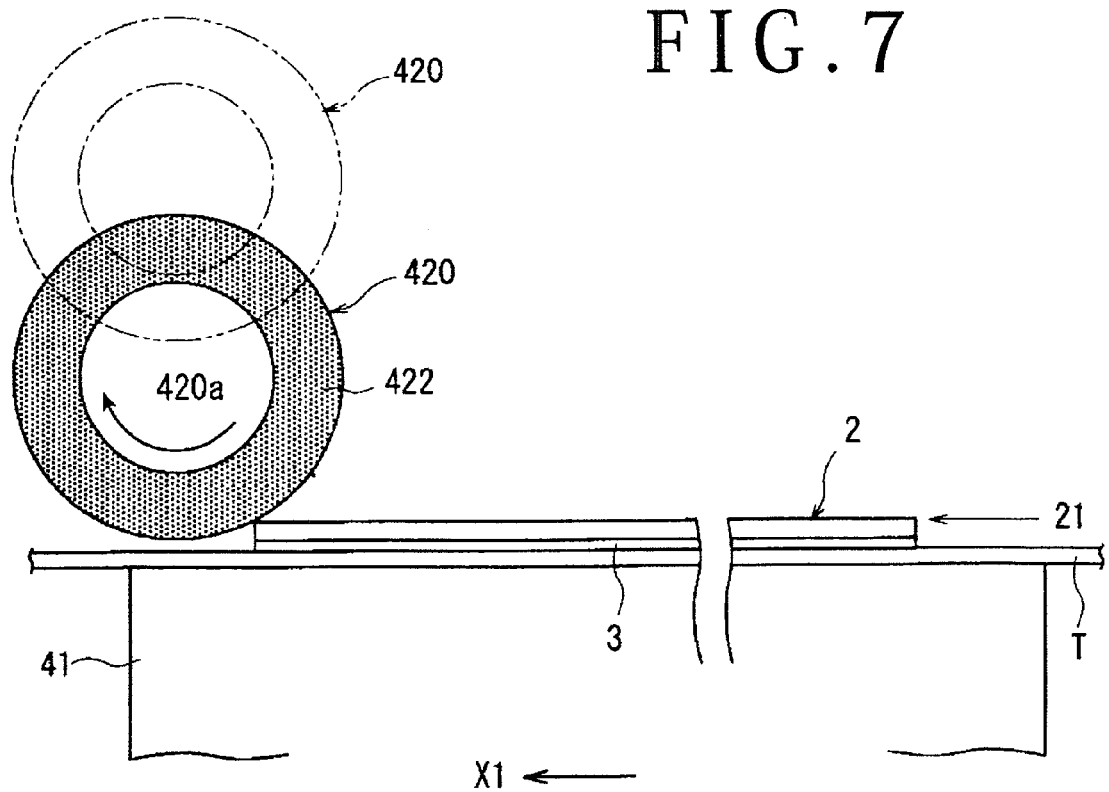
FIG. 7 illustrates a condition in which the wafer cutting step in the method of manufacturing a device based on the present invention is carried out by use of the cutting apparatus shown in FIG. 5.

After the planned dividing lines 21 formed in the semiconductor wafer 2 held on the chuck table 41 are thus detected and the alignment of the cutting region is thereby conducted, the chuck table 41 holding the semiconductor 2 thereon is moved to a cutting start position in the cutting region. In this case, the semiconductor wafer 2 is so positioned that, as shown in FIG. 7, one end (in FIG. 7, the left end) of the planned dividing line 21 to be cut is positioned a predetermined amount to the right side from the position just under the cutting blade 420. Then, the cutting blade 420 is rotated at a predetermined rotational speed in a direction indicated by arrow 420a in FIG. 7, is fed downwards as cross feed (infeed) from a stand-by position indicated by two-dotted chain lines by a cross feed (infeed) mechanism, and is positioned into a cross feed (infeed) position such that the lower end of the peripheral edge of the annular knife edge 422 constituting the cutting blade 420 reaches the back-side surface (lower surface) of the semiconductor wafer 2, as indicated by solid lines in FIG. 7.

Figure 8:
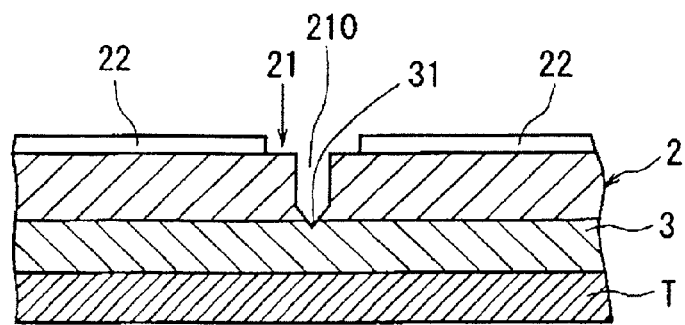
FIG. 8 is an enlarged sectional view of a semiconductor wafer having undergone the wafer cutting step illustrated by FIG. 7.

After the cross feed (infeed) of the cutting blade 420 is performed as above, the cutting blade 420 is rotated at a predetermined rotational speed in the direction indicated by arrow 420a in FIG. 7, and, while keeping the rotation, the chuck table 41 is moved at a predetermined cutting feed speed in a direction indicated by arrow X1 in FIG. 7. Thereafter, when the right end of the semiconductor wafer 2 held on the chuck table 41 has passed the position just under the cutting blade 420, the movement of the chuck table 41 is stopped. As a result, as shown in FIG. 8, the semiconductor wafer 2 is cut along the planned dividing line 21 by a cutting groove 210 having substantially the same width as the width of the annular knife edge 422, and the back-side surface (lower surface) of the semiconductor wafer 2 is cut by only the peripheral edge of the annular knife edge 422 constituting the cutting blade 420. In this case, if the peripheral edge of the annular knife edge 422 constituting the cutting blade 420 is positioned on the side of the adhesive film 3 relative to the back-side surface (lower surface) of the semiconductor wafer 2, a breaking groove 31 V-shaped in section is formed in the adhesive film 3 as shown in FIG. 8, by the peripheral part 422a V-shaped in sectional shape of the annular knife edge 422.

Incidentally, in the case where the peripheral edge of the annular knife edge 422 constituting the cutting blade 420 reaches the back-side surface (lower surface) of the semiconductor wafer 2 but does not cut the adhesive film 3, a breaking line having an extremely small width is formed in the adhesive film 3 along the planned dividing line 21. Thus, in the wafer cutting step, only the peripheral edge of the peripheral part 422a V-shaped in sectional shape of the annular knife edge 422 constituting the cutting blade 420 makes contact with the adhesive film 3. Therefore, even when the thickness of the semiconductor wafer 2 is not more than 200 μm, the semiconductor wafer 2 would not show irregular motions, and chipping would not occur at the cut surfaces of the semiconductor wafer 2. In addition, since the adhesive film 3 is not cut during the wafer cutting step, clogging would not occur at the knife edge 42 constituting the cutting blade 420, and whisker-like cuttings would not be generated.

The wafer cutting step as above is carried out along all the planned dividing lines 21 formed in the semiconductor wafer 2. As a result, the semiconductor wafer 2 is cut along the planned dividing lines 21 to be divided into individual devices 22, and the breaking grooves 31 or the breaking lines having an extremely small width are formed in the adhesive film 3 in a grid pattern along the planned dividing lines 21 (along the peripheral edges of the individual devices 22).

After the wafer cutting step is performed as above, an adhesive film breaking step is carried out in which the dicing tape T is expanded to exert tension on the adhesive film 3, thereby breaking the adhesive film 3 along the breaking grooves 31. This adhesive film breaking step is carried out by use of an adhesive film breaking apparatus shown in FIG. 9. The adhesive film breaking apparatus 6 shown in FIG. 9 includes a base 61, a first table 62 disposed on the base 61 so as to be movable in a direction indicated by arrow Y, and a second table 63 disposed on the first table 62 so as to be movable in a direction indicated by arrow X which is orthogonal to the arrow Y. The base 61 is formed in a rectangular shape, and, on the upper surfaces of both side parts of the base 61, two guide rails 611 and 612 are disposed in parallel to each other along the direction indicated by arrow Y. Incidentally, of the two guide rails, one guide rail 611 is provided in its upper surface with a guide groove 611a which is V-shaped in section.

The first table 62 is formed in a window frame-like shape having a rectangular aperture 621 in its central part. One side part of the first table 62 is provided on its lower surface with a guided rail 622 to be slidably fitted in the guide groove 611a formed in the one guide rail 611 provided on the base 61. In addition, on the upper surfaces of both side parts of the first table 62, two guide rails 623 and 624 are disposed in parallel to each other along a direction orthogonal to the guided rail 622. Incidentally, of the two guide rails, one guide rail 623 is provided in its upper surface with a guide groove 623a which is V-shaped in section. Of the first table 62 thus configured, the guided rail 622 is fitted in the guide groove 611a formed in the one guide rail 611 provided on the base 61, and the lower surface of a side part on the other side is mounted on the other guide rail 612 provided on the base 61. The adhesive film breaking apparatus 6 in the embodiment shown has a first moving means 64 by which the first table 62 is moved in the direction indicated by arrow Y along the guide rails 611 and 612 provided on the base 61.

The second table 63 is formed in a rectangular shape, and one side part thereof is provided on its lower surface with a guided rail 632 to be slidably fitted in the guide groove 623a formed in the one guide rail 623 provided on the first table 62. Of the second table 63 thus configured, the guided rail 632 is fitted in the guide groove 623a formed in the one guide rail 623 provided on the first table 62, and the lower surface of a side part on the other side is mounted on the other guide rail 624 provided on the first table 62. The adhesive film breaking apparatus 6 in the embodiment shown has a second moving means 65 by which the second table 63 is moved in the direction indicated by arrow X along the guide rails 623 and 624 provided on the first table 62.

The adhesive film breaking apparatus 6 in the embodiment shown includes a frame holding means 66 for holding the annular frame F, and a tape expanding means 67 for expanding the dicing tape T attached to the annular frame F held by the frame holding means 66. The frame holding means 66 is composed of an annular frame holding member 661, and a plurality of clamps 662 as fixing means arranged at the outer periphery of the frame holding member 661. An upper surface of the frame holding means 661 forms a mount surface 661a on which to mount the annular frame F, and the annular frame F is mounted on the mount surface 661a. Then, the annular frame F placed on the mount surface 661a is fixed on the frame holding member 661 by the clamps 662. The frame holding means 66 thus configured is disposed on the upper side of the second table 63, and is so supported that it can be advanced and retracted in the vertical direction by the tape expanding means 67 which will be described later.

The tape expanding means 67 has an expansion drum 670 disposed on the inside of the annular frame holding member 661. The expansion drum 670 has an inner diameter and an outer diameter which are smaller than the inner diameter of the annular frame F and greater than the outer diameter of the semiconductor wafer 2 adhered to the dicing tape T attached to the annular frame F, respectively. In addition, the expansion drum 670 has, at its lower end part, a mounting part to be turnably fitted in an inner peripheral surface of a hole (not shown) provided in the second table 63, and a support flange 671 formed to project radially outwards is provided on an outer peripheral surface on the upper side of the mounting part. The tape expanding means 67 in the embodiment shown has a support means 672 by which the annular frame holding member 661 can be advanced and retracted in the vertical direction. The support means 672 is composed of a plurality of air cylinders 673 disposed on the support flange 671, and piston rods 674 thereof are connected to a lower surface of the annular frame holding member 661. The support means 672 thus composed of the plurality of air cylinders 673 selectively moves the annular frame holding member 661 into a reference position such that the mount surface 661a is located substantially at the same level as the top surface of the expansion drum 670 as shown in FIGS. 9 and 10A, and into an expansion position such that the mount surface 661a is located a predetermined amount to the lower side from the top surface of the expansion drum 670 as shown in FIG. 10B.

Figure 9:
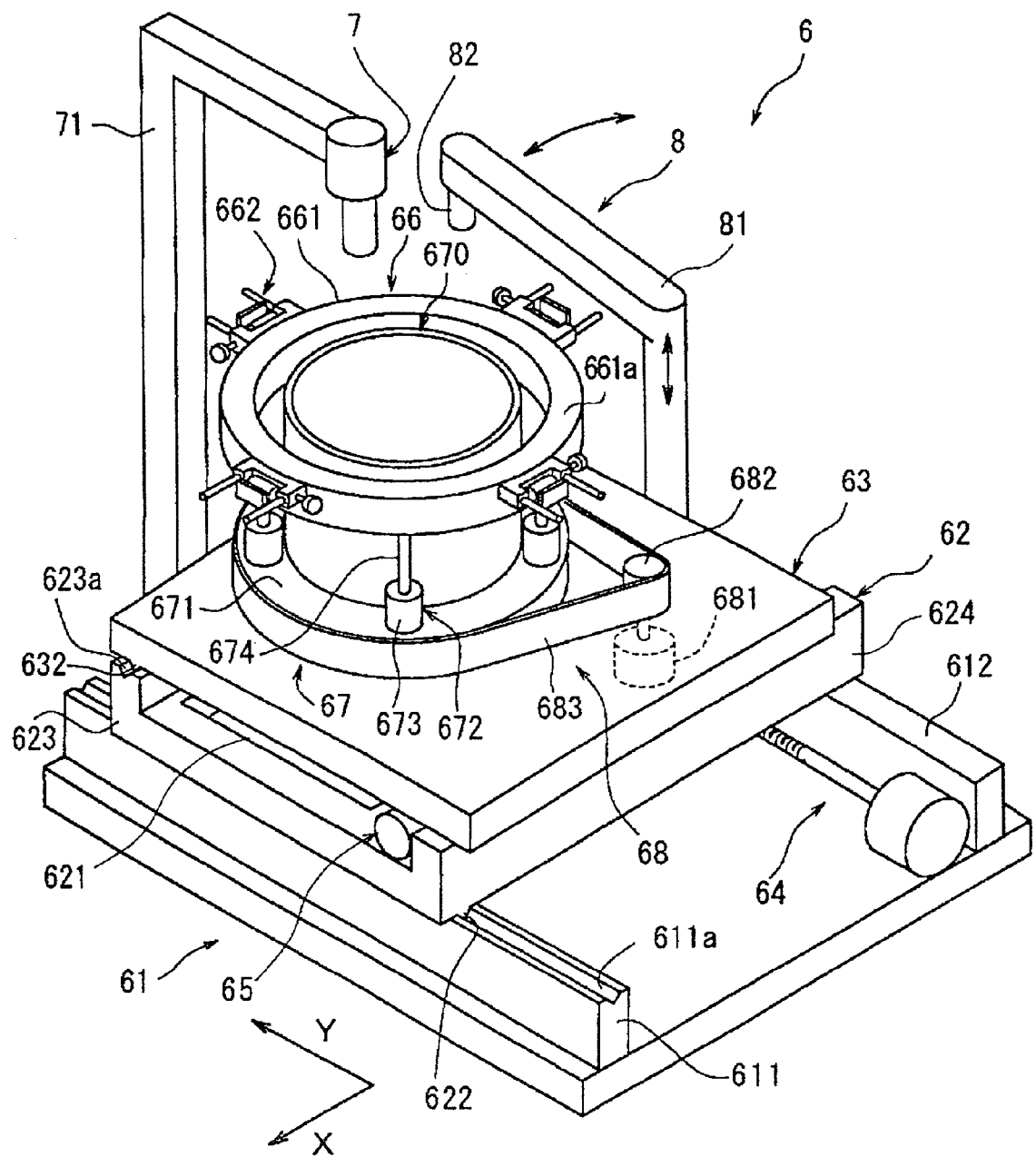
FIG. 9 is a perspective view of an adhesive film breaking apparatus for carrying out an adhesive film breaking step in the method of manufacturing a device based on the present invention.
Figure 10A:
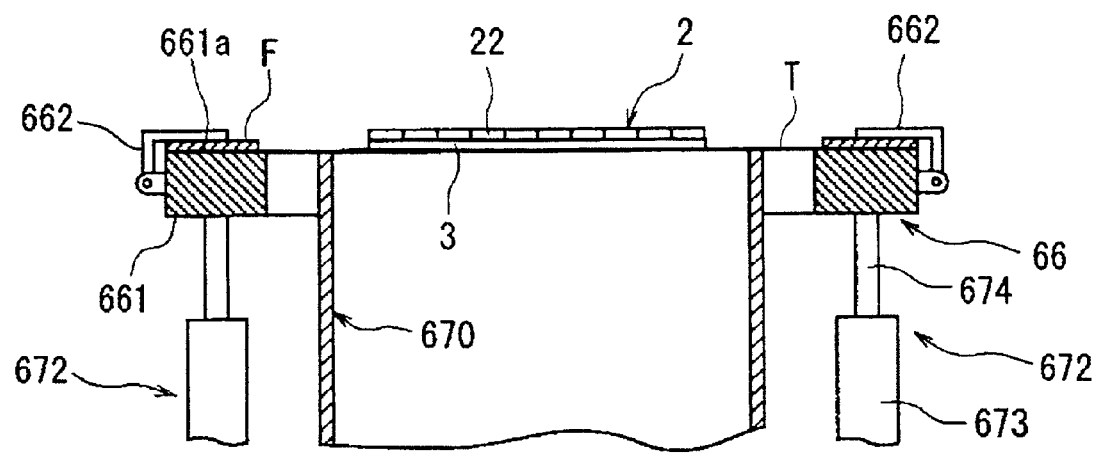
FIGS. 10A and 10B illustrate the adhesive film breaking step in the method of manufacturing a device based on the present invention.
Figure 10B:
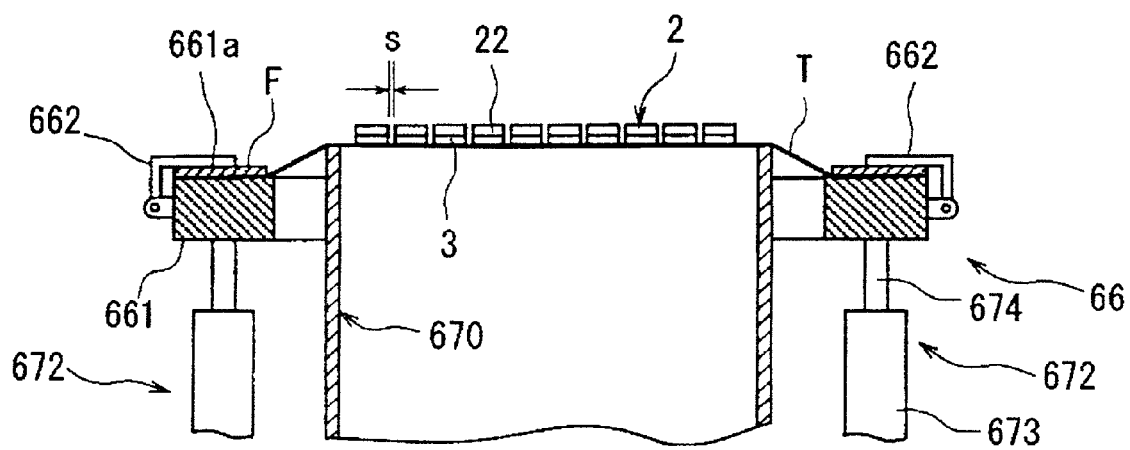

The adhesive film breaking apparatus 6 in the embodiment shown has a turning means 68 for turning the expansion drum 670 and the frame holding member 661, as shown in FIG. 9. The turning means 68 includes a pulse motor 681 disposed at the second table 63, a pulley 682 attached to a rotary shaft of the pulse motor 681, and an endless belt 683 wrapped around the pulley 682 and the support flange 671 of the expansion drum 670. The turning means 68 thus configured rotates the expansion drum 670 through the functions of the pulley 682 and the endless belt 683, by driving the pulse motor 681.

The adhesive film breaking apparatus 6 in the embodiment shown has a detection means 7 for detecting the individually divided devices 22 of the semiconductor wafer 2 supported, through the dicing tape T, on the annular frame F held by the annular frame holding member 661. The detection means 7 is attached to an L-shaped stand 71 disposed on the base 61. The detection means 7 is composed of an optical system and an image pick-up device (CCD), etc., and is operative to pick up an image of the individually divided devices 22 of the semiconductor wafer 2 supported through the dicing tape T on the annular frame F held on the annular support member 661, to convert the picked-up image into an electrical signal, and to send the electrical signal to the control means (not shown).

In addition, the adhesive film breaking apparatus 6 in the embodiment shown has a pick-up means 8 for picking up the individually divided devices 22 from the dicing tape T. The pick-up means 8 is composed of a slewing arm 81 disposed on the base 61, and a pick-up collet 82 attached to the tip of the slewing arm 81, and the slewing arm 81 is slewed by a driving means (not shown). Incidentally, the slewing arm 81 is configured to be movable in the vertical direction, and the pick-up collet 82 attached to its tip can pick up each of the individually divided devices 22 adhered to the dicing tape T.

The adhesive film breaking apparatus 6 in the embodiment shown is configured as above, and the adhesive film breaking step carried out by use of the adhesive film breaking apparatus 6 will be described referring mainly to FIGS. 10A and 10B. The annular frame F on which the semiconductor wafer 2 (divided into the individual device 22) having undergone the wafer cutting step mentioned above and the adhesive film 3 (provided with the breaking grooves 31 in a grid pattern along the peripheral edges of the individual devices 22) attached to the back-side surface of the semiconductor wafer 2 are supported through the dicing tape T is mounted on the mount surface 661a of the frame holding member 661 constituting the frame holding means 66, as shown in FIG. 10A, and is fixed onto the frame holding member 661 by the clamps 662 (frame holding step). In this instance, the frame holding member 661 is positioned in the reference position shown in FIG. 10A.

After the annular frame 4 on which the semiconductor wafer 2 (divided into the individual devices 22) with the adhesive film 3 attached to the back-side surface thereof is supported through the dicing tape T is fixed onto the frame holding member 661 positioned in the reference position as shown in FIG. 10A, the plurality of air cylinders 673 as the supporting means 672 constituting the tape expanding means 67 are operated so as to lower the annular frame holding member 661 to the expansion position shown in FIG. 10B. Consequently, the annular frame F fixed on the mount surface 661a of the frame holding member 661 is also lowered, so that the dicing tape T attached to the annular frame F is expanded while making contact with the upper end edge of the expansion drum 670, as shown in FIG. 10B (tape expanding step).

Figure 11:
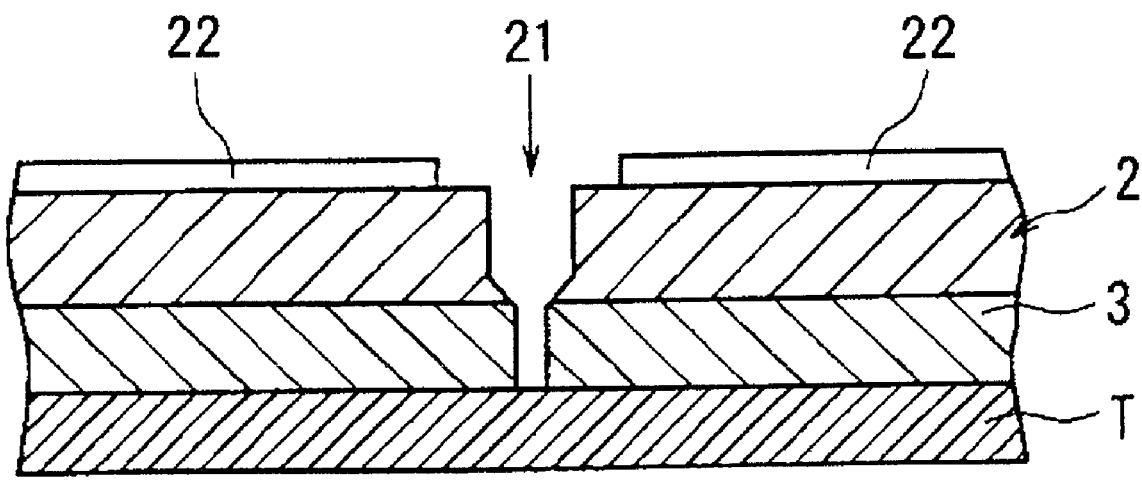
FIG. 11 is an enlarged sectional view of a semiconductor wafer having undergone the adhesive film breaking step in the method of manufacturing a device based on the present invention.

As a result, tension is radially exerted on the adhesive film 3 adhered to the dicing tape T, so that gaps S between the individual devices 22 to which the adhesive film 3 is attached are widened, and the adhesive film 3 is broken along the peripheral edges of the devices 22, as shown in FIG. 11. In this case, since the adhesive film 3 has been provided with the breaking grooves 31 V-shaped in section or the breaking lines having an extremely small width along the planned dividing lines 21 (along the peripheral edges of the devices 22) as shown in FIG. 8, the adhesive film 3 is broken along the breaking grooves 31 V-shaped in section or the breaking lines having an extremely small width, so that the broken surfaces become uniform without becoming wavy. Incidentally, in carrying out the tape expanding step, it is desirable to cool the adhesive film 3 by, for example, jetting a cooling fluid (air) at 10° C. or below to the adhesive film 3, thereby lowering the extensibility of the adhesive film 3.

Figure 12:
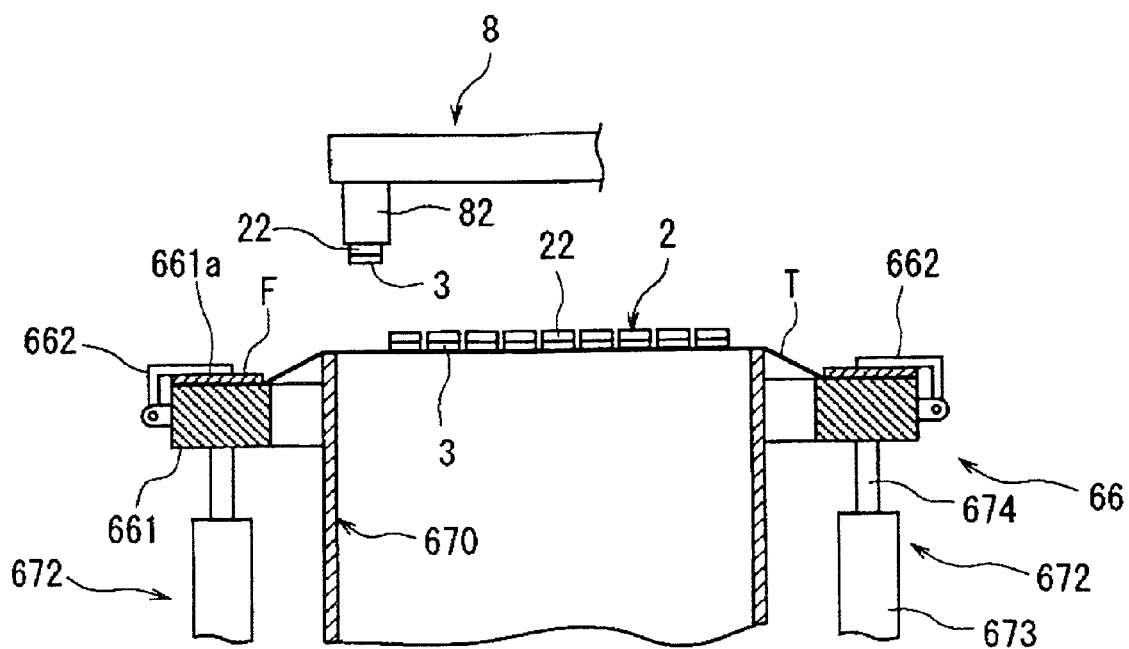
FIG. 12 illustrates a pick-up step in the method of manufacturing a device based on the present invention.

After the adhesive film breaking step is performed as above-mentioned, the first moving means 64 and the second moving means 65 are operated to move the first table 62 in the direction indicated by arrow Y (see FIG. 9) and to move the second table 63 in the direction of arrow X (see FIG. 9) so that the individual devices 22 adhered through the adhesive film 3 to the dicing tape T attached to the annular frame F held on the frame holding member 661 are positioned into the position just under the detection means 7. Then, by operating the detection means 7, it is checked whether or not the gaps between the individual devices 22 conform to the direction indicated by arrow Y or the direction indicated by arrow X. If the direction of the gaps between the individual devices 22 is deviated from the direction indicated by arrow Y or the direction indicated by arrow X, the turning means 68 is operated to turn the frame holding means 66 so as to obtain the conformity desired. Next, while moving the first table 62 in the direction indicated by arrow Y (see FIG. 9) and moving the second table 63 in the direction of arrow X (see FIG. 9), the pick-up means 8 is operated so that the device 22 (with the adhesive film 3 attached to the back-side surface thereof) positioned in a predetermined position is suction gripped by the pick-up collet 82, as shown in FIG. 12, whereby the device 22 is released from the dicing tape T and picked up (pick-up step), before being fed onto a tray (not shown) or fed to a die bonding step.

Figure 13:
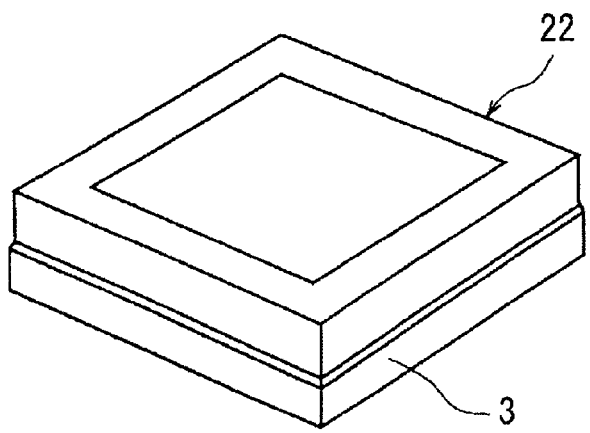
FIG. 13 is a perspective view of a device manufactured by the method of manufacturing a device based on the present invention.

In the pick-up step, the device 22 can be easily picked up without making contact with the adjacent devices 22, since the gaps S between the individual devices 22 with the adhesive film 3 attached thereto have been widened as above-mentioned. Therefore, even where the thickness of the devices 22 is not more than 100 μm, the devices 22 can be securely picked up without being damaged due to contact with other ones. Onto the back-side surface of the device 22 picked up in this manner, the adhesive film 3 broken uniformly along the peripheral edges of the device 22 is attached, as shown in FIG. 13.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a device, comprising:
an adhesive film attaching step of attaching an adhesive film to a back-side surface of a wafer in which devices are formed respectively in a plurality of regions demarcated by planned dividing lines formed in a grid pattern in a face-side surface of said wafer;
a wafer supporting step of adhering the adhesive film side of said wafer with said adhesive film attached thereto to a surface of a dicing tape attached to an annular frame;
a wafer cutting step of holding the dicing tape side of said wafer adhered to said surface of said dicing tape onto a chuck table of a cutting apparatus, and cutting said wafer along said planned dividing lines by use of a cutting blade having an annular knife edge which is V-shaped in sectional shape of a peripheral part thereof; and
an adhesive film breaking step of breaking said adhesive film along cutting grooves formed in said wafer, by expanding said dicing tape so as to exert tension on said adhesive film, after said wafer cutting step is performed.

2. The method of manufacturing a device as set forth in claim 1, wherein said wafer cutting step is carried out in a condition where the lower end of a peripheral edge of said annular knife edge is so located as to reach said back-side surface of said wafer adhered to said surface of said dicing tape.

3. The method of manufacturing a device as set forth in claim 1, further comprising a pick-up step in which, after said adhesive film breaking step is performed, each of said individual devices obtained through division along said planned dividing lines is picked up by detaching said device from said dicing tape, with said adhesive film attached to a back-side surface of said device.

* * * * *